(12) United States Patent
Tong et al.

(10) Patent No.: US 11,243,259 B2
(45) Date of Patent: Feb. 8, 2022

(54) INSULATION RESISTANCE DETECTION CIRCUIT, DETECTION METHOD, AND DETECTION APPARATUS

(71) Applicant: Huawei Technologies Co., Ltd., Shenzhen (CN)

(72) Inventors: Wenping Tong, Shenzhen (CN); Kui Zhou, Dongguan (CN); Wencheng Wang, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 146 days.

(21) Appl. No.: 16/673,666

(22) Filed: Nov. 4, 2019

(65) Prior Publication Data

US 2020/0064410 A1 Feb. 27, 2020

Related U.S. Application Data

(63) Continuation of application No. PCT/CN2018/085092, filed on Apr. 28, 2018.

(30) Foreign Application Priority Data

May 3, 2017 (CN) ............................ 201710306654

(51) Int. Cl.
*G06F 11/30* (2006.01)
*G01R 31/389* (2019.01)
(Continued)

(52) U.S. Cl.
CPC ....... *G01R 31/389* (2019.01); *G01R 31/3648* (2013.01); *G01R 31/385* (2019.01)

(58) Field of Classification Search
CPC .................................................. G01R 31/389
See application file for complete search history.

(56) References Cited

U.S. PATENT DOCUMENTS 8,446,158 B1 5/2013 Jansson
2009/0033428 A1 2/2009 Karri
(Continued)

FOREIGN PATENT DOCUMENTS

CN 101359897 A 2/2009
CN 101412433 A 4/2009
(Continued)

OTHER PUBLICATIONS

Yang et al., "an Active Detection Method for Insulation Performace of High Voltage Power Battery Pack," with partial English Translation, Computing Technology and Automation, vol. 34, No. 3, pp. 55-59 (total 9 pages), China National Knowledge Infrastructure (CNKI), Beijing, China (Sep. 30, 2015). (Year: 2015).*
(Continued)

*Primary Examiner* — Phuong Huynh
(74) *Attorney, Agent, or Firm* — Leydig, Voit & Mayer, Ltd.

(57) ABSTRACT

An insulation resistance detection circuit, detection method, and detection apparatus are provided. The circuit includes an alternating-current signal source, a resonant cavity, a first resistor, a second resistor, a third resistor, a fourth resistor, a first switch, and a second switch. The alternating-current signal source is sequentially connected to the first resistor, the resonant cavity, the first switch, the second resistor, and the third resistor in series to form a loop. The first resistor is connected to a positive electrode of the alternating-current signal source, and the third resistor is connected to a negative electrode of the alternating-current signal source. One end of the second switch is connected to a negative electrode of a to-be-detected battery, the other end of the second switch is connected to the fourth resistor, and the other end of the fourth resistor is connected to ground.

13 Claims, 7 Drawing Sheets

(51) Int. Cl.
  *G01R 31/385* (2019.01)
  *G01R 31/36* (2020.01)

(56) References Cited

U.S. PATENT DOCUMENTS

| | | |
|---|---|---|
| 2012/0126839 A1 | 5/2012 | Schaefer et al. |
| 2013/0027049 A1 | 1/2013 | Sukup |
| 2014/0070808 A1 | 3/2014 | Reykowski et al. |
| 2014/0095093 A1 | 4/2014 | Hong et al. |
| 2015/0042350 A1 | 2/2015 | Bober |
| 2016/0282393 A1 | 9/2016 | Bruwer et al. |
| 2017/0016951 A1 | 1/2017 | Sung et al. |

FOREIGN PATENT DOCUMENTS

| | | |
|---|---|---|
| CN | 102053183 A | 5/2011 |
| CN | 102854395 A | 1/2013 |
| CN | 103472306 A | 12/2013 |
| CN | 103547937 A | 1/2014 |
| CN | 104142433 A | 11/2014 |
| CN | 105911353 A | 8/2016 |
| CN | 106461733 A | 2/2017 |
| EP | 3130932 A1 | 2/2017 |
| WO | 2012036498 A2 | 3/2012 |

OTHER PUBLICATIONS

Wei Xinlao et al., "An On-line Measurement Method for Cable Insulation Resistance in a GPT's Neutral point Directly Grounded System," Proceedings of the 5th International Conference on Properties and Applications of Dielectric Materials, pp. 386-388, Seoul, Korea (May 25-30, 1997).

Yang et al. "An Active Detection Method for Insulation Performance of High Voltage Power Battery Pack," with partial English translation, Computing Technology and Automation, vol. 34, No. 3, pp. 55-59 (total 9 pages), China National Knowledge Infrastructure (CNKI), Beijing, China (Sep. 30, 2015).

Ding et al., "An Insulation Resistance Detection Method Based on Low Frequency Impulse Response," with English abstract, Journal of Automotive Technology Auto Sci-Tech, pp. 52-55 (Aug. 31, 2015).

"Electrically propelled road vehicles—Safety specifications—Part 1: On-board rechargeable energy storage system (REESS)," GB/T 18384.1-2015, pp. 1-8, Standardization Administration of the People's Republic of China, Beijing, China (2015).

* cited by examiner

INSULATION RESISTANCE DETECTION CIRCUIT, DETECTION METHOD, AND DETECTION APPARATUS

CROSS-REFERENCE TO RELATED APPLICATIONS

This application is a continuation of International Patent Application No. PCT/CN2018/085092, filed on Apr. 28, 2018, which claims priority to Chinese Patent Application No. 201710306654.0, filed on May 3, 2017. The disclosures of the aforementioned applications are hereby incorporated by reference in their entireties.

TECHNICAL FIELD

Embodiments of this application relate to circuit and electronic technologies, and in particular, to an insulation resistance detection circuit, detection method, and detection apparatus.

BACKGROUND

With rapid development of new energy vehicles, electric vehicles attach ever-increasing attention. As a power source of an electric vehicle, a high-voltage power battery pack has a quite high voltage class, and insulation performance of the high-voltage power battery pack directly affects safe operation of the electric vehicle. Quickly and accurately detecting an insulation status of the battery pack for a chassis of the vehicle and timely performing troubleshooting are basic conditions for safe operation of the electric vehicle. This is of great significance for ensuring passenger safety, normal operation of electric equipment, and safe operation of the vehicle.

FIG. 1 is a schematic diagram of an insulation resistance detection circuit of an active injected battery. As shown in FIG. 1, an equation is constructed by injecting an alternating-current signal, to calculate an insulation resistance parallel value and determine whether an insulation failure occurs, and an insulation resistance value is calculated through a connection to a direct current resistance network. A part within a dashed-line box is equivalent to a to-be-tested battery, and $U_s$ represents an injected alternating-current power source. In this technology, the equation is constructed by injecting the alternating-current signal, to calculate the insulation resistance parallel value and determine whether an insulation failure occurs, and the insulation resistance value is calculated through the connection to the direct current resistance network. As shown in FIG. 1, the equation is constructed by injecting the alternating-current signal, to calculate the insulation resistance parallel value and determine whether an insulation failure occurs, and the insulation resistance value is calculated through the connection to the direct current resistance network. The part within the dashed-line box is equivalent to the to-be-tested battery, $U_s$ represents the injected alternating-current power source, R represents a measured resistor, C represents an isolation capacitor, and $R_1$ and $R_2$ are connected resistors for insulation resistance calculation. The "connected resistors" $R_1$ and $R_2$ are disconnected, and an alternating-current signal source is turned on. A parallel resistance value $R_{pn}$ may be obtained through calculation by measuring a voltage at two ends of the "measured resistor", and $R_{pn}$ is compared with a specified threshold $R_{th}$ to determine whether an insulation resistance failure occurs. If it is determined that an insulation resistance failure occurs, insulation resistance values $R_p$ and $R_n$ are calculated, where $R_p$ and $R_n$ are calculated in the following manner: obtaining a voltage equation related to $R_p$ and $R_n$ by closing the "connected resistors" $R_1$ and $R_2$, and calculating the values $R_p$ and $R_n$ based on the parallel value $R_{pn}$ of $R_p$ and $R_n$ that is obtained in the foregoing second step.

However, in the foregoing solution, a capacitance value of the capacitor C needs to be known to calculate the insulation resistance parallel value of the battery. However, precision of the capacitance value of the capacitor actually is low, and a deviation of the capacitance value affects insulation resistance measurement precision. In addition, impact of insulation resistance parasitic capacitance is not considered in the foregoing solution, but actually existing parasitic capacitance affects precision of active injection method—based detection. As a result, insulation resistance detection precision for the battery is low.

SUMMARY

Embodiments of this application provide an insulation resistance detection circuit, detection method, and detection apparatus, to reduce impact of low precision of an actual capacitance value of a capacitor and a deviation of the capacitance value on insulation resistance measurement precision and reduce impact of actual existing parasitic capacitance on active injection method-based detection, thereby improving insulation resistance detection precision for a battery.

A first aspect of the embodiments of this application provides an insulation resistance detection circuit, including:

an alternating-current signal source, a resonant cavity, a first resistor, a second resistor, a third resistor, a fourth resistor, a first switch, and a second switch, where the alternating-current signal source is sequentially connected to the first resistor, the resonant cavity, the first switch, the second resistor, and the third resistor in series to form a loop, where the first resistor is connected to a positive electrode of the alternating-current signal source, and the third resistor is connected to a negative electrode of the alternating-current signal source;

a positive electrode of a to-be-detected battery is connected between the first switch and the resonant cavity, and the negative electrode of the alternating-current signal source is connected to ground;

one end of the second switch is connected to a negative electrode of the to-be-detected battery, the other end of the second switch is connected to the fourth resistor, and the other end of the fourth resistor is connected to the ground; and when the to-be-detected battery is detected, the alternating-current signal source is configured to provide an alternating-current signal.

In this solution, the resonant cavity is added to an active test circuit. Generally, the resonant cavity includes an inductor and a capacitor. In addition, in a detection process, an equation is constructed by considering impact of parasitic capacitance of the to-be-detected battery, to effectively reduce impact of the capacitor and the parasitic capacitance on insulation resistance detection precision for the to-be-detected battery, thereby improving the insulation resistance detection precision for the to-be-detected battery.

In specific implementation, the insulation resistance detection circuit further includes:

a first voltage sampling unit and a second voltage sampling unit, where the first voltage sampling unit is connected to the first resistor in parallel, to detect a voltage at two ends of the first resistor; and the second voltage sampling unit is connected to the third resistor in parallel, to detect a voltage at two ends of the third resistor.

In specific implementation, the insulation resistance detection circuit further includes a fifth resistor and a third switch, where the fifth resistor is connected between the alternating-current signal source and the resonant cavity in series, and the third switch is connected to two ends of the fifth resistor in parallel.

In this solution, the fifth resistor may be connected between the first resistor and the alternating-current signal source in series, or may be connected between the first resistor and the resonant cavity in series. This is not limited in this solution.

In specific implementation, the resonant cavity includes a capacitor and an inductor that are connected in series.

A second aspect of the embodiments of this application provides an insulation resistance detection circuit, including:

an alternating-current signal source, a resonant cavity, a first resistor, a second resistor, a third resistor, a fourth resistor, a first switch, and a second switch, where the alternating-current signal source is sequentially connected to the first resistor, the resonant cavity, the first switch, the second resistor, and the third resistor in series to form a loop, where the first resistor is connected to a positive electrode of the alternating-current signal source, and the third resistor is connected to a negative electrode of the alternating-current signal source;

a negative electrode of a to-be-detected battery is connected between the first switch and the resonant cavity, and the negative electrode of the alternating-current signal source is connected to ground;

one end of the second switch is connected to a positive electrode of the to-be-detected battery, the other end of the second switch is connected to the fourth resistor, and the other end of the fourth resistor is connected to the ground; and when the to-be-detected battery is detected, the alternating-current signal source is configured to provide an alternating-current signal.

In this solution, the resonant cavity is added to an active test circuit. Generally, the resonant cavity includes an inductor and a capacitor. In addition, in a detection process, an equation is constructed by considering impact of parasitic capacitance of the to-be-detected battery, to effectively reduce impact of the capacitor and the parasitic capacitance on insulation resistance detection precision for the to-be-detected battery, thereby improving the insulation resistance detection precision for the to-be-detected battery.

In specific implementation, the insulation resistance detection circuit further includes:

a first voltage sampling unit and a second voltage sampling unit, where the first voltage sampling unit is connected to the first resistor in parallel, to detect a voltage at two ends of the first resistor; and the second voltage sampling unit is connected to the third resistor in parallel, to detect a voltage at two ends of the third resistor.

In specific implementation, the insulation resistance detection circuit further includes a fifth resistor and a third switch, where the fifth resistor is connected between the alternating-current signal source and the resonant cavity in series, and the third switch is connected to two ends of the fifth resistor in parallel.

In specific implementation, the resonant cavity includes a capacitor and an inductor that are connected in series.

A third aspect of the embodiments of this application provides an insulation resistance detection method, applied to the insulation resistance detection circuit provided in any one of the implementations of the first aspect or the second aspect; and the method includes:

controlling the alternating-current signal source to provide an alternating-current signal, and detecting a voltage of a first resistor; and constructing an equation based on the alternating-current signal and the voltage of the first resistor, and obtaining an insulation resistance parallel value and a parasitic capacitance parallel value of a to-be-detected battery.

In specific implementation, the method further includes:

determining, based on the insulation resistance parallel value, whether an insulation failure occurs on the to-be-detected battery.

In specific implementation, the determining, based on the insulation resistance parallel value, whether an insulation failure occurs on the to-be-detected battery includes:

if the insulation resistance parallel value is greater than a preset resistance threshold, determining that no insulation failure occurs on the to-be-detected battery;

if the insulation resistance parallel value is less than the resistance threshold and greater than half of the resistance threshold, obtaining a positive electrode insulation resistance and a negative electrode insulation resistance of the to-be-detected battery, and determining, based on the positive electrode insulation resistance and the negative electrode insulation resistance, whether an insulation failure occurs on the to-be-detected battery; or if the insulation resistance parallel value is less than half of the resistance threshold, determining that an insulation failure occurs on the to-be-detected battery.

In specific implementation, the controlling the alternating-current signal source to provide an alternating-current signal, and detecting a voltage of the first resistor includes:

controlling to disconnect a first switch and a second switch;

controlling the alternating-current signal source to inject a sine signal with a frequency $\omega_1$ and an amplitude value $U_s$, and detecting that a voltage at two ends of the first resistor is $U_{m1}$; and controlling the alternating-current signal source to inject a sine signal with a frequency $\omega_2$ and an amplitude value $U_s$, and detecting that a voltage at the two ends of the first resistor is $U_{m2}$; and the constructing an equation based on the alternating-current signal and the voltage of the first resistor, and obtaining an insulation resistance parallel value and a parasitic capacitance parallel value of a to-be-detected battery includes:

constructing an equation (1) based on $U_s$ and $U_{m1}$:

$$|U_{m1}| = \frac{R_r\sqrt{(\omega_1 C_b R_b)^2 + 1^2}}{\sqrt{(\omega_1 C_b R_b R_r)^2 + (R_b + R_r)^2}}|U_s|;$$

constructing an equation (2) based on $U_s$ and $U_{m2}$:

$$|U_{m2}| = \frac{R_r\sqrt{(\omega_2 C_b R_b)^2 + 1^2}}{\sqrt{(\omega_2 C_b R_b R_r)^2 + (R_b + R_r)^2}}|U_s|;$$

and obtaining the insulation resistance parallel value $R_b$ and the parasitic capacitance parallel value $C_b$ of the to-be-detected battery through calculation according to the equation (1) and the equation (2), where $R_r$ represents a resistance value of the first resistor.

In specific implementation, the obtaining a positive electrode insulation resistance and a negative electrode insulation resistance of the to-be-detected battery includes:

controlling to turn off the alternating-current signal source;

closing a first switch, obtaining a voltage $U_{n1}$ of a third resistor through detection, and constructing an equation (3) based on a voltage U of the to-be-detected battery and the voltage $U_{n1}$ of the third resistor:

$$\frac{U(R_p // (R_1 + R_2))}{R_p // (R_1 + R_2) + R_n} \frac{R_2}{R_1 + R_2} = U_{n1};$$

closing the first switch and a second switch, obtaining a voltage $U_{n2}$ of the third resistor through detection, and constructing an equation (4) based on the voltage U of the to-be-detected battery and the voltage $U_{n1}$ of the third resistor:

$$\frac{U(R_p // (R_1 + R_2))}{R_p // (R_1 + R_2) + R_n} \frac{R_2}{R_1 + R_2} = U_{n2};$$

and obtaining the positive electrode insulation resistance $R_p$ and the negative electrode insulation resistance $R_n$ of the to-be-detected battery through calculation according to the equation (3), the equation (4), and an equation (5)

$$\frac{R_p R_n}{R_p + R_n} = R_b,$$

where $R_1$ represents a resistance value of the second resistor, $R_2$ represents a resistance value of the third resistor, $R_3$ represents a resistance value of a fourth resistor, and $R_b$ represents the insulation resistance parallel value of the to-be-detected battery.

In specific implementation, the determining, based on the positive electrode insulation resistance and the negative electrode insulation resistance, whether an insulation failure occurs on the to-be-detected battery includes:

if both the positive electrode insulation resistance and the negative electrode insulation resistance are greater than the resistance threshold, determining that no insulation failure occurs on the to-be-detected battery; or if neither the positive electrode insulation resistance nor the negative electrode insulation resistance is greater than the resistance threshold, determining that an insulation failure occurs on the to-be-detected battery.

A fourth aspect of the embodiments of this application provides an insulation resistance detection apparatus, applied to an insulation resistance detection apparatus that uses the insulation resistance detection circuit provided in the first aspect or the second aspect; and the apparatus includes:

a processor, configured to: control the alternating-current signal source to provide an alternating-current signal, and detect a voltage of a first resistor, where the processor is further configured to: construct an equation based on the alternating-current signal and the voltage of the first resistor, and obtain an insulation resistance parallel value and a parasitic capacitance parallel value of a to-be-detected battery.

In specific implementation, the processor is further configured to determine, based on the insulation resistance parallel value, whether an insulation failure occurs on the to-be-detected battery.

In specific implementation, the processor is specifically configured to:

if the insulation resistance parallel value is greater than a preset resistance threshold, determine that no insulation failure occurs on the to-be-detected battery;

if the insulation resistance parallel value is less than the resistance threshold and greater than half of the resistance threshold, obtain a positive electrode insulation resistance and a negative electrode insulation resistance of the to-be-detected battery, and determine, based on the positive electrode insulation resistance and the negative electrode insulation resistance, whether an insulation failure occurs on the to-be-detected battery; or if the insulation resistance parallel value is less than half of the resistance threshold, determine that an insulation failure occurs on the to-be-detected battery.

In specific implementation, the processor is further specifically configured to:

control to disconnect a first switch and a second switch;

control the alternating-current signal source to inject a sine signal with a frequency $\omega_1$ and an amplitude value $U_s$, and detect that a voltage at two ends of the first resistor is $U_{m1}$; and control the alternating-current signal source to inject a sine signal with a frequency $\omega_2$ and an amplitude value $U_s$, and detect that a voltage at the two ends of the first resistor is $U_{m2}$; and the constructing an equation based on the alternating-current signal and the voltage of the first resistor, and obtaining an insulation resistance parallel value and a parasitic capacitance parallel value of a to-be-detected battery includes:

constructing an equation (1) based on $U_s$ and $U_{m2}$:

$$|U_{m1}| = \frac{R_r\sqrt{(\omega_1 C_b R_b)^2 + 1^2}}{\sqrt{(\omega_1 C_b R_b R_r)^2 + (R_b + R_r)^2}}|U_s|;$$

constructing an equation (2) based on $U_s$ and $U_{m2}$:

$$|U_{m2}| = \frac{R_r\sqrt{(\omega_2 C_b R_b)^2 + 1^2}}{\sqrt{(\omega_2 C_b R_b R_r)^2 + (R_b + R_r)^2}}|U_s|;$$

and obtaining the insulation resistance parallel value $R_b$ and the parasitic capacitance parallel value $C_b$ of the to-be-detected battery through calculation according to the equation (1) and the equation (2), where $R_r$ represents a resistance value of the first resistor.

In specific implementation, the processor is further specifically configured to:

control to turn off the alternating-current signal source;

close a first switch, obtain a voltage $U_{n1}$ of a third resistor through detection, and construct an equation (3) based on a voltage U of the to-be-detected battery and the voltage $U_{n1}$ of the third resistor:

$$\frac{U(R_p // (R_1 + R_2))}{R_p // (R_1 + R_2) + R_n} \frac{R_2}{R_1 + R_2} = U_{n1};$$

close the first switch and a second switch, obtain a voltage $U_{n2}$ of the third resistor through detection, and construct an equation (4) based on the voltage U of the to-be-detected battery and the voltage $U_{n1}$ of the third resistor:

$$\frac{U(R_p // (R_1 + R_2))}{R_p // (R_1 + R_2) + R_n} \frac{R_2}{R_1 + R_2} = U_{n2};$$

and obtain the positive electrode insulation resistance $R_p$ and the negative electrode insulation resistance $R_n$ of the to-be-detected battery through calculation according to the equation (3), the equation (4), and an equation (5)

$$\frac{R_p R_n}{R_p + R_n} = R_b,$$

where $R_1$ represents a resistance value of the second resistor, $R_2$ represents a resistance value of the third resistor, $R_3$ represents a resistance value of a fourth resistor, and $R_b$ represents the insulation resistance parallel value of the to-be-detected battery.

In specific implementation, the processor is further configured to:

if both the positive electrode insulation resistance and the negative electrode insulation resistance are greater than the resistance threshold, determine that no insulation failure occurs on the to-be-detected battery; or if neither the positive electrode insulation resistance nor the negative electrode insulation resistance is greater than the resistance threshold, determine that an insulation failure occurs on the to-be-detected battery.

A fifth aspect of the embodiments of this application provides a device, including at least one processor, a memory, and a communications interface. The at least one processor, the memory, and the communications interface are connected to each other; the memory stores a computer-executable instruction; and the at least one processor executes the computer-executable instruction stored in the memory, so that the device exchanges data with an insulation resistance detection circuit of the device through the communications interface to perform the insulation resistance detection method provided in the third aspect or the various implementations of the third aspect.

A sixth aspect of the embodiments of this application provides a readable storage medium. The readable storage medium stores a computer-executable instruction. When at least one processor of a device executes the computer-executable instruction, the device performs the insulation resistance detection method provided in the third aspect or the various implementations of the third aspect.

A seventh aspect of the embodiments of this application provides a program product. The program product includes an executable instruction, and the executable instruction is stored in a readable storage medium. At least one processor of a device may read the executable instruction from the readable storage medium, and the at least one processor executes the executable instruction, so that the device implements the insulation resistance detection method provided in the third aspect or the various implementations of the third aspect.

According to the insulation resistance detection circuit, detection method, and detection apparatus provided in the embodiments of this application, parasitic capacitance and insulation resistance of the to-be-detected battery are detected by using an active injected detection circuit. The insulation resistance detection circuit includes the alternating-current signal source, the resonant cavity, the first resistor, the second resistor, the third resistor, the fourth resistor, the first switch, and the second switch. The alternating-current signal source is sequentially connected to the first resistor, the resonant cavity, the first switch, the second resistor, and the third resistor in series to form a loop. The first resistor is connected to the positive electrode of the alternating-current signal source. The third resistor is connected to the negative electrode of the alternating-current signal source. The positive electrode of the to-be-detected battery is connected between the first switch and the resonant cavity, and the negative electrode of the alternating-current signal source is connected to the ground. One end of the second switch is connected to the negative electrode of the to-be-detected battery, the other end of the second switch is connected to the fourth resistor, and the other end of the fourth resistor is connected to the ground. When the to-be-detected battery is detected, the alternating-current signal source is controlled to provide the alternating-current signal, the equation related to the insulation resistance parallel value and the parasitic capacitance parallel value of the to-be-detected battery is constructed based on the alternating-current signal and the voltage of the first resistor, and the insulation resistance parallel value of the to-be-detected battery is obtained. An error resulting from a precision difference of a capacitor is rectified inside the resonant cavity, and the parasitic capacitance of the to-be-detected battery is considered. This effectively improves insulation resistance detection precision.

DESCRIPTION OF EMBODIMENTS

Embodiments of this application provide an active injected insulation resistance detection circuit and detection method. This can eliminate impact of a connected auxiliary resistor on an insulation status of a battery system, and eliminate impact of a capacitor C and insulation resistance parasitic capacitance in an active injection method on detection precision. In addition, this can also accurately determine an insulation failure and simplify a voltage measurement circuit. The following describes the technical solutions in the embodiments of this application by using several specific implementations.

Figure 2:
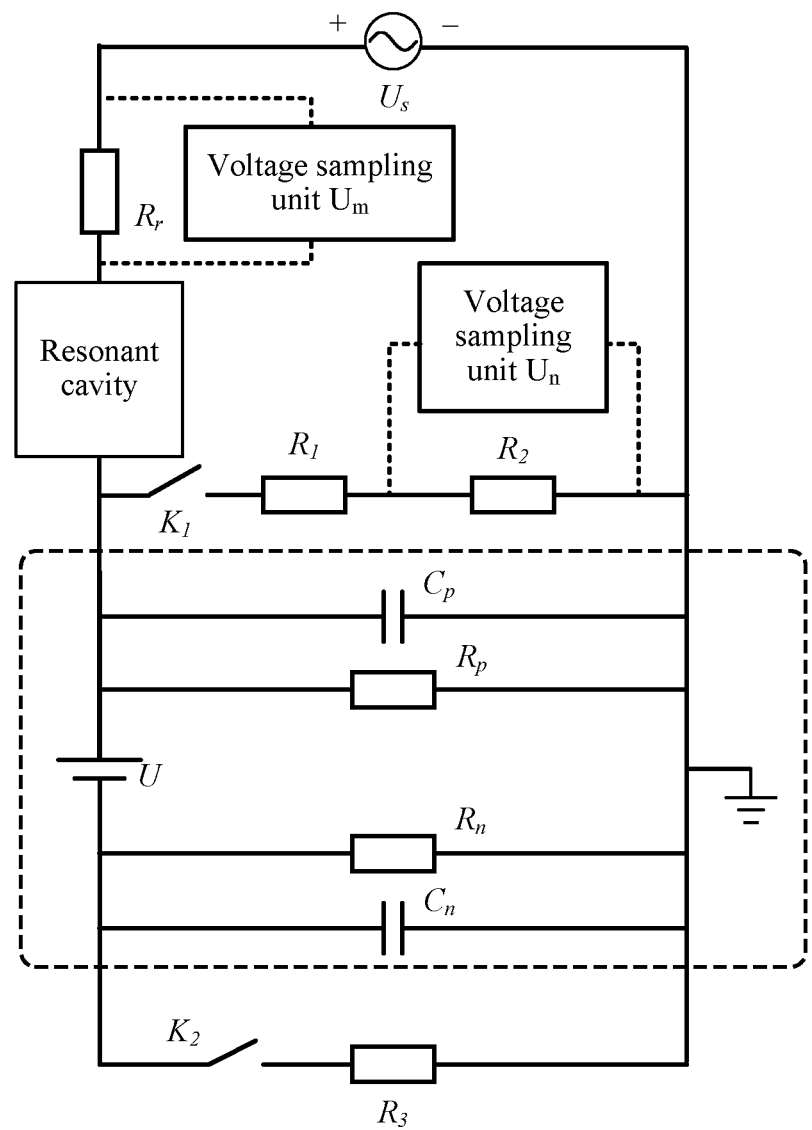
FIG. 2 is a principle diagram of Embodiment 1 of an insulation resistance detection circuit according to embodiments of this application.

FIG. 2 is a principle diagram of Embodiment 1 of an insulation resistance detection circuit according to embodiments of this application. As shown in FIG. 2, the insulation resistance detection circuit includes an alternating-current signal source $U_s$, a resonant cavity, a first resistor $R_r$, a second resistor $R_1$, a third resistor $R_2$, a fourth resistor $R_3$, a first switch $K_1$, and a second switch $K_2$.

The alternating-current signal source $U_s$ is sequentially connected to the first resistor $R_r$, the resonant cavity, the first switch $K_1$, the second resistor $R_1$, and the third resistor $R_2$ in series to form a loop. The first resistor $R_r$ is connected to a positive electrode of the alternating-current signal source $U_s$, and the third resistor $R_2$ is connected to a negative electrode of the alternating-current signal source $U_s$.

In this solution, a to-be-detected battery (a part within a dashed-line box is an equivalent circuit of the to-be-detected battery, and an entirety of the dashed-line box is the to-be-detected battery) is excluded from a structure of the detection circuit.

A positive electrode of the to-be-detected battery is connected between the first switch $K_1$ and the resonant cavity, and the negative electrode of the alternating-current signal source $U_s$ is connected to ground. In other words, the positive electrode of the to-be-detected battery and the ground are parallel-connected to two sides of the first switch $K_1$, the second resistor $R_1$, and the third resistor $R_2$ that are sequentially connected in series.

One end of the second switch $K_2$ is connected to a negative electrode of the to-be-detected battery, the other end of the second switch $K_2$ is connected to the fourth resistor $R_3$, and the other end of the fourth resistor $R_3$ is connected to the ground. In other words, two ends of an entirety obtained by connecting the second switch $K_2$ to the fourth resistor $R_3$ in series is parallel-connected to two sides of the negative electrode of the to-be-detected battery and the ground.

Figure 1:
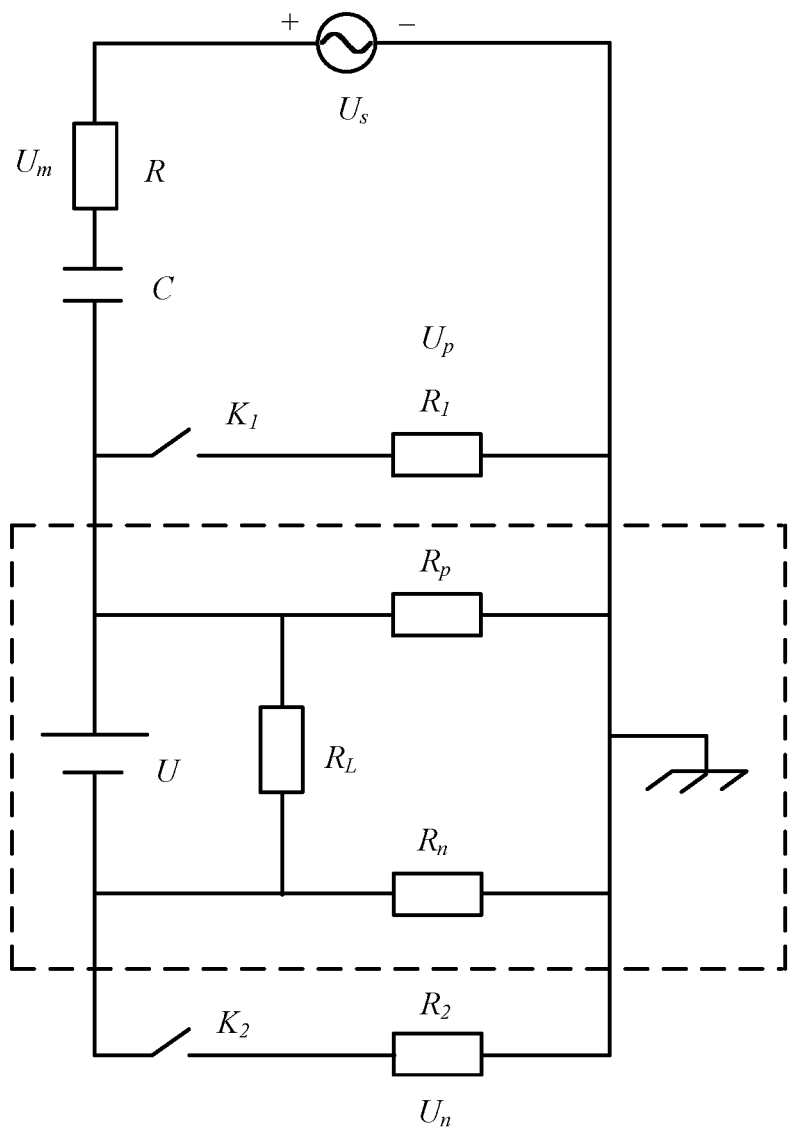
FIG. 1 is a schematic diagram of an insulation resistance detection circuit of an active injected battery.

In the foregoing solution, for details, refer to the principle diagram in FIG. 1. The detection circuit structure includes one alternating-current signal source $U_s$ and one resonant cavity. In an implementation, the resonant cavity includes an inductor, a capacitor, auxiliary resistors $R_r$, $R_1$, $R_2$, and $R_3$, and auxiliary switches $K_1$ and $K_2$. A part within a dashed-line box represents an equivalent circuit of a power battery (a to-be-detected battery), and includes an ideal voltage source U, an insulation resistor $R_p$ and a parasitic capacitor $C_p$ between a positive electrode of the power battery and a reference ground, and an insulation resistor $R_n$ and a parasitic capacitor $C_n$ between a negative electrode of the power energy and the reference ground. In other words, the to-be-detected battery is equivalent to a power source that includes an ideal power source, a parasitic capacitor, and an insulation resistor.

Optionally, in specific application of the circuit, components connected between the positive/negative electrode of the to-be-detected battery and the ground may be alternatively exchanged. The negative electrode of the to-be-detected battery is connected between the first switch $K_1$ and the resonant cavity; the negative electrode of the alternating-current signal source $U_s$ is connected to the ground; one end of the second switch $K_2$ is connected to the positive electrode of the to-be-detected battery; the other end of the second switch $K_2$ is connected to the fourth resistor $R_3$; and the other end of the fourth resistor $R_3$ is connected to the ground. In other words, the negative electrode of the to-be-detected battery and the ground are parallel-connected to two sides of the first switch $K_1$, the second resistor $R_1$, and the third resistor $R_2$ that are sequentially connected in series, and an entirety obtained by connecting the second switch $K_2$ to the fourth resistor $R_3$ in series is parallel-connected to two sides of the positive electrode of the to-be-detected battery and the ground.

When the to-be-detected battery is detected, the alternating-current signal source is configured to provide an alternating-current signal, an equation related to an insulation resistance parallel value and a parasitic capacitance parallel value of the to-be-detected battery is constructed based on the alternating-current signal and a voltage of the first resistor, and the insulation resistance parallel value of the to-be-detected battery is obtained. Therefore, whether a failure occurs on the to-be-detected battery may be still determined based on the insulation resistance parallel value.

Further, to detect voltage values of the first resistor $R_r$ and the third resistor $R_2$, the insulation resistance detection circuit further includes a first voltage sampling unit $U_m$ and a second voltage sampling unit $U_n$. The first voltage sampling unit $U_m$ is connected to the first resistor $R_r$ in parallel, to detect a voltage at two ends of the first resistor $R_r$. The second voltage sampling unit $U_n$ is connected to the third resistor $R_2$ in parallel, to detect a voltage at two ends of the third resistor $R_2$.

Figure 3:
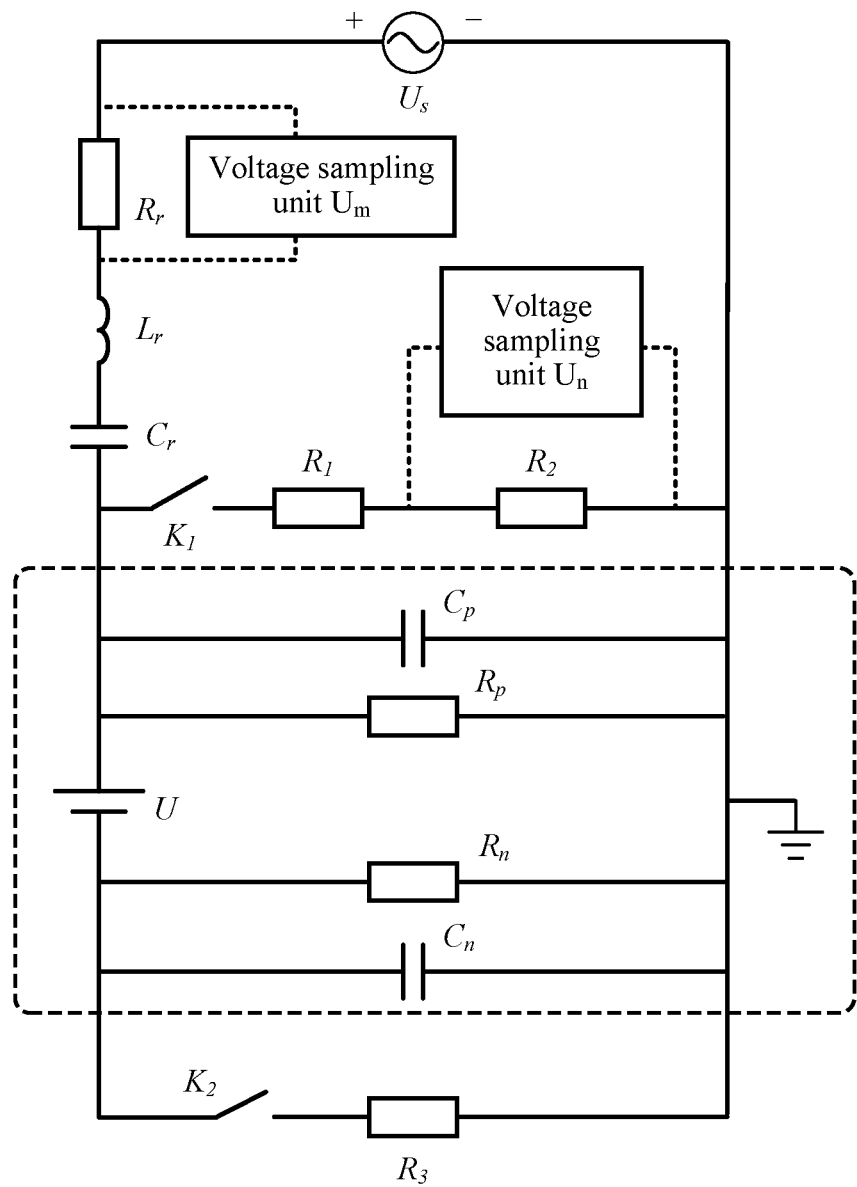
FIG. 3 is a principle diagram of Embodiment 2 of an insulation resistance detection circuit according to embodiments of this application.

FIG. 3 is a principle diagram of Embodiment 2 of an insulation resistance detection circuit according to embodiments of this application. As shown in FIG. 3, other constituents are the same as those in the foregoing embodiment, and a resonant cavity in the detection circuit is specifically implemented as an inductor $L_r$ and a capacitor $C_r$, in other words, the resonant cavity includes the capacitor $C_r$ and the inductor $L_r$ that are connected in series.

Figure 4:
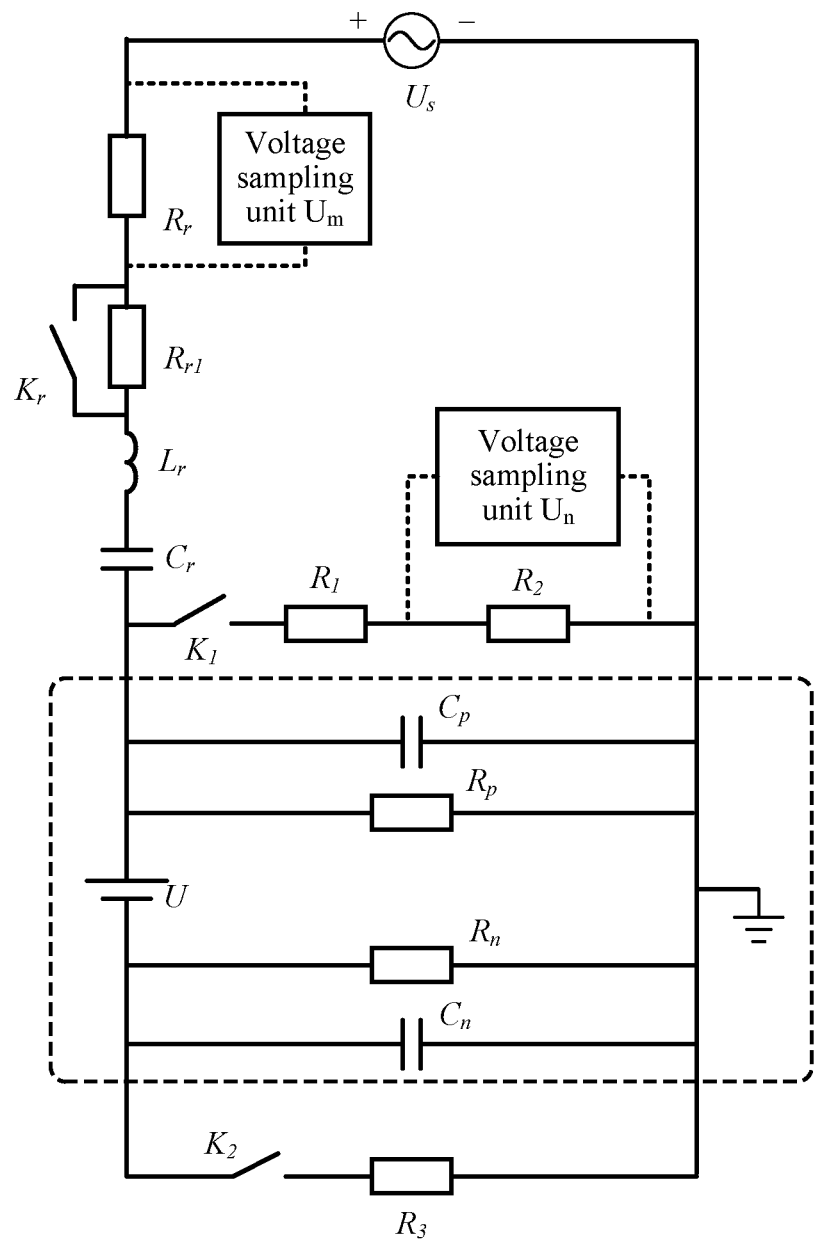
FIG. 4 is a principle diagram of Embodiment 3 of an insulation resistance detection circuit according to embodiments of this application.

FIG. 4 is a principle diagram of Embodiment 3 of an insulation resistance detection circuit according to embodiments of this application. As shown in FIG. 4, in specific implementation of the insulation resistance detection circuit, a fifth resistor may be further connected between a resonant cavity and an alternating-current signal source $U_s$ in series, and a switch is connected to two ends of the fifth resistor in parallel. In other words, the insulation resistance detection circuit further includes the fifth resistor $R_{r1}$ and a third switch $K_r$; and the fifth resistor $R_{r1}$ is connected between the alternating-current signal source $U_s$ and the resonant cavity in series, and the third switch $K_r$ is connected to the fifth resistor $R_{r1}$ in parallel.

On the basis of the several insulation resistance detection circuits, the following describes specific implementation methods for detecting insulation resistance performance.

Figure 5:
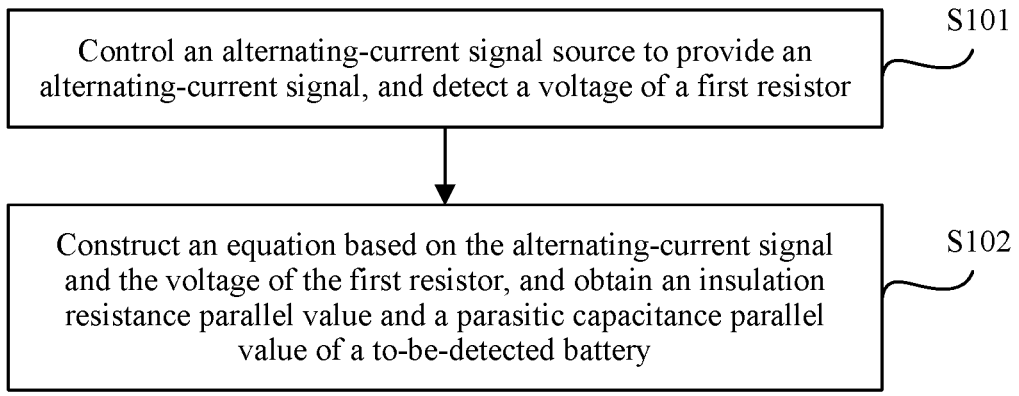
FIG. 5 is a flowchart of an insulation resistance detection method according to an embodiment of this application.

FIG. 5 is a flowchart of an insulation resistance detection method according to an embodiment of this application. As shown in FIG. 5, the method is applied to a device or an apparatus that can perform operation processing. A to-be-detected battery is connected to the foregoing detection circuit to collect data for calculation and analysis. Specifically, the insulation resistance detection method includes the following steps.

S101: Control the alternating-current signal source to provide an alternating-current signal, and detect a voltage of a first resistor.

S102: Construct an equation based on the alternating-current signal and the voltage of the first resistor, and obtain an insulation resistance parallel value and a parasitic capacitance parallel value of the to-be-detected battery.

In the foregoing steps, an equation related to the parasitic capacitance parallel value and the insulation resistance parallel value of the to-be-detected battery is constructed for calculation by detecting voltage values of different auxiliary resistors and with reference to input of the alternating-current signal source, to obtain the insulation resistance parallel value.

Further, whether an insulation failure occurs on the to-be-detected battery may be further determined based on the insulation resistance parallel value, and this may be specifically implemented in the following manner:

if the insulation resistance parallel value is greater than a preset resistance threshold, determining that no insulation failure occurs on the to-be-detected battery;

if the insulation resistance parallel value is less than the resistance threshold and greater than half of the resistance threshold, obtaining a positive electrode insulation resistance and a negative electrode insulation resistance of the to-be-detected battery, and determining, based on the positive electrode insulation resistance and the negative electrode insulation resistance, whether an insulation failure occurs on the to-be-detected battery; or if the insulation resistance parallel value is less than half of the resistance threshold, determining that an insulation failure occurs on the to-be-detected battery.

The following describes the detection method with reference to different circuit implementations.

In the circuit shown in FIG. 2 or FIG. 3, an insulation resistance detection procedure includes the following steps.

Step 1: Inject an alternating-current signal $U_s$, and calculate an insulation resistance parallel value $R_b$ and a parasitic capacitance parallel value $C_b$.

Step 2: Determine an insulation status of a power battery based on the insulation resistance parallel value $R_b$ and a preset resistance threshold (also referred to as a threshold resistance) $R_{th}$, and take corresponding measures.

(1) When $R_b > R_{th}$, determine that no insulation failure occurs and the power battery runs properly.

(2) When $\frac{1}{2}R_{th} < R_b < R_{th}$, determine that an insulation failure may occur on the power battery.

In this case, the alternating-current signal source $U_s$ is disconnected, the auxiliary switches $K_1$ and $K_2$ are progressively closed, and insulation resistance values $R_p$ and $R_n$ are calculated. When $R_p > R_{th}$ and $R_n > R_{th}$, it is determined that no insulation failure occurs, or when neither $R_p > R_{th}$ nor $R_n > R_{th}$, it is determined that an insulation failure occurs, and troubleshooting is performed.

(3) When $R_b < \frac{1}{2}R_{th}$, determine that an insulation failure occurs, and perform troubleshooting.

Figure 6:
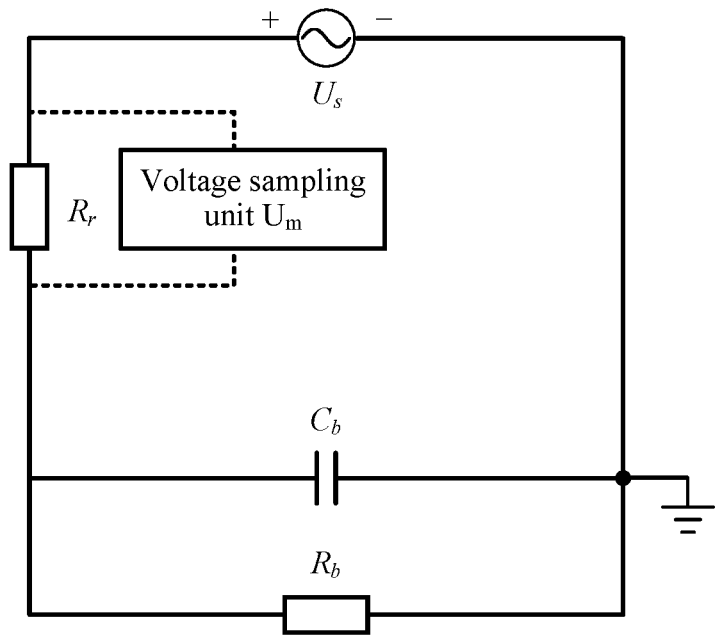
FIG. 6 is an equivalent circuit diagram of a frequency disturbance method according to an embodiment of this application.

Specifically, the alternating-current signal $U_s$ may be injected, and the insulation resistance parallel value and the parasitic capacitance parallel value are calculated. A frequency disturbance method, a resistance disturbance method, and an amplitude phase method may be used herein. For the frequency disturbance method, FIG. 6 is an equivalent circuit diagram of the frequency disturbance method according to an embodiment of this application. As shown in FIG. 6, $R_b$ is a parallel value of reference ground insulation resistance values $R_p$ and $R_n$ relative to a positive electrode and a negative electrode of the power battery, and $C_b$ is a parallel value of reference ground parasitic capacitance values $C_p$ and $C_n$ relative to the positive electrode and the negative electrode of the power battery. Because the inductor $L_r$ and the capacitor $C_r$ are in a resonant state or at a resonant point nearby at a frequency when the alternating-current signal is injected, an equivalent impedance of the resonant cavity may be approximately zero. Therefore, values of the capacitor $C_r$ and the inductor $L_r$ do not affect insulation resistance calculation. In addition, the capacitor $C_r$ isolates a direct-current high voltage of the power battery, and an active detection circuit does not affect insulation resistance of the power battery.

First, a first switch and a second switch are controlled to be disconnected; the alternating-current signal source is controlled to inject a sine signal with a frequency $\omega_1$ and an amplitude value $U_s$, and it is detected that a voltage at two ends of the first resistor is $U_{m1}$; and the alternating-current signal source is controlled to inject a sine signal with a frequency $\omega_2$ and an amplitude value $U_s$, and it is detected that a voltage at the two ends of the first resistor is $U_{m2}$.

The switches $K_1$ and $K_2$ are disconnected, the alternating-current signal source $U_s$ injects the sine signal with the frequency $\omega_1$ and the amplitude value $U_s$, and the voltage $U_{m1}$ at the two ends of the first resistor (an auxiliary resistor) $R_r$ is measured to obtain the following equation (1):

$$|U_{m1}| = \frac{R_r\sqrt{(\omega_1 C_b R_b)^2 + 1^2}}{\sqrt{(\omega_1 C_b R_b R_r)^2 + (R_b + R_r)^2}}|U_s| \quad (1)$$

The alternating-current signal source $U_s$ injects the sine signal with the frequency $\omega_2$ and the amplitude value $U_s$, and the voltage $U_{m2}$ at the two ends of the first resistor (an auxiliary resistor) $R_r$ is measured to obtain the following equation (2):

$$|U_{m2}| = \frac{R_r\sqrt{(\omega_2 C_b R_b)^2 + 1^2}}{\sqrt{(\omega_2 C_b R_b R_r)^2 + (R_b + R_r)^2}}|U_s| \quad (2)$$

$R_r$ represents a resistance value of the first resistor, $\omega_1 \neq \omega_2$, and the insulation resistance parallel value $R_b$ and the parasitic capacitance parallel value $C_b$ may be obtained through calculation by combining the equation (1) and the equation (2).

Then, an insulation status of the power battery may be determined based on the insulation resistance parallel value $R_b$ and the resistance threshold (the preset threshold resistance) $R_{th}$, and corresponding measures are taken.

(1) When $R_b > R_{th}$, determine that no insulation failure occurs and a battery system is properly powered on and runs.

(2) When $\frac{1}{2}R_{th} < R_b < R_{th}$, determine that an insulation failure may occur on the battery system, but at least one of the reference ground insulation resistance values $R_p$ and $R_n$ relative to the positive electrode and the negative electrode of the battery is less than $2R_{th}$. In this case, the alternating-current signal source $U_s$ is disconnected, the auxiliary switches $K_1$ and $K_2$ are progressively closed, the insulation resistance values $R_p$ and $R_n$ are calculated, and it is determined whether an insulation failure occurs.

When $R_p > R_{th}$ and $R_n > R_{th}$, it is determined that no insulation failure occurs, or when neither $R_p > R_{th}$ nor $R_n > R_{th}$, it is determined that an insulation failure occurs, and troubleshooting is performed.

Because the power battery has relatively poor insulation performance (a kilohm level) in such an insulation status, the connected auxiliary resistors $R_1$, $R_2$, and $R_3$ (a megaohm level) have little impact on the insulation status of the power battery when the auxiliary switches $K_1$ and $K_2$ are closed.

(3) When $R_b < \frac{1}{2}R_{th}$, determine that an insulation failure occurs; and disconnect a load, and stop running the battery system.

The insulation resistance parallel value $R_b$ is compared with $R_{th}$, and the insulation status of the power battery is divided into three states, so that accurate determining can be implemented.

The resistance threshold or the threshold resistance $R_{th}$ is set according to a related technology standard and a voltage value of the power battery. For example, a voltage of an electrical vehicle battery pack is U=500 V, and according to the corresponding technology standard: *ISO/DIS 6469-1: 2000 Electric Road Vehicles—Safety Specifications—Part 1: On-Board Electrical Energy Storage*, a value of an insulation resistance parameter needs to be greater than 500 Ω/V as required in this standard. Therefore, the reference ground insulation resistance values $R_p$ and $R_n$ relative to a positive electrode and a negative electrode of the electrical vehicle battery pack need to be greater than 250 kΩ. Therefore, the threshold resistance $R_{th}$ is set to 250 kΩ.

Figure 7:
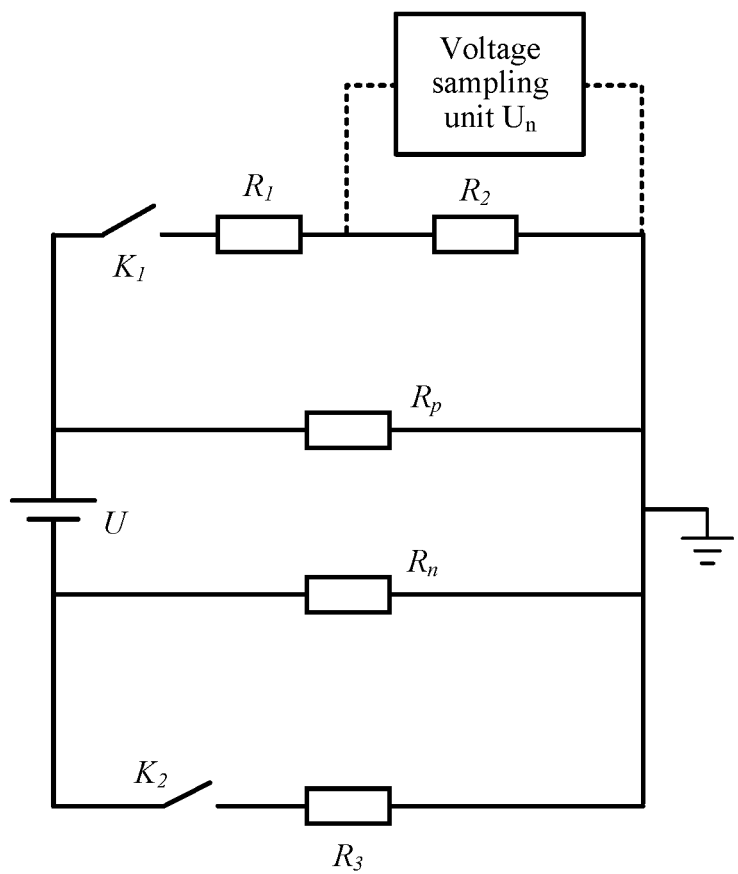
FIG. 7 is an equivalent circuit diagram of an improved balancing bridge method according to an embodiment of this application.

In the foregoing process, an improved balancing bridge method may be alternatively used to calculate the insulation resistance values $R_p$ and $R_n$. FIG. 7 is an equivalent circuit diagram of the improved balancing bridge method according to an embodiment of this application. As shown in FIG. 7, only one voltage measurement unit $U_n$ is required in comparison with a conventional balancing bridge method. A specific implementation process includes the following steps:

controlling to turn off the alternating-current signal source;

closing a first switch $K_1$, obtaining a voltage $U_{n1}$ of a third resistor through detection, and constructing an equation (3) based on a voltage U of the to-be-detected battery and the voltage $U_{n1}$ of the third resistor:

$$\frac{U(R_p // (R_1 + R_2))}{R_p // (R_1 + R_2) + R_n} \frac{R_2}{R_1 + R_2} = U_{n1}; \quad (3)$$

closing the first switch $K_1$ and a second switch $K_2$, obtaining a voltage $U_{n2}$ of the third resistor through detection, and constructing an equation (4) based on the voltage U of the to-be-detected battery and the voltage $U_{n1}$ of the third resistor:

$$\frac{U(R_p // (R_1 + R_2))}{R_p // (R_1 + R_2) + R_n} \frac{R_2}{R_1 + R_2} = U_{n2}; \quad (4)$$

and obtaining the positive electrode insulation resistance $R_p$ and the negative electrode insulation resistance $R_n$ of the to-be-detected battery through calculation according to the equation (3), the equation (4), and an equation (5)

$$\frac{R_p R_n}{R_p + R_n} = R_b,$$

where $R_1$ represents a resistance value of the second resistor, $R_2$ represents a resistance value of the third resistor, $R_3$ represents a resistance value of a fourth resistor, and $R_b$ represents an insulation resistance parallel value of the to-be-detected battery.

Specifically, a calculation process is that the following equation (5) may be obtained by dividing the equation (3) by the equation (4):

$$\frac{R_p // (R_1 + R_2) + R_n // (R_3)}{R_p // (R_1 + R_2) + R_n} = \frac{U_{n1}}{U_{n2}} \quad (5)$$

In the foregoing process, the parallel value $R_b$ of the insulation resistance values $R_p$ and $R_n$ is obtained according to the following equation:

$$\frac{R_p R_n}{R_p + R_n} = R_b \quad (6)$$

The insulation resistance values $R_p$ and $R_n$ may be obtained through calculation by combining the equation (5) and the equation (6). Compared with the conventional balancing bridge method, this method reduces one voltage detection unit by increasing resistance disturbance once, thereby simplifying a voltage measurement circuit.

Figure 8:
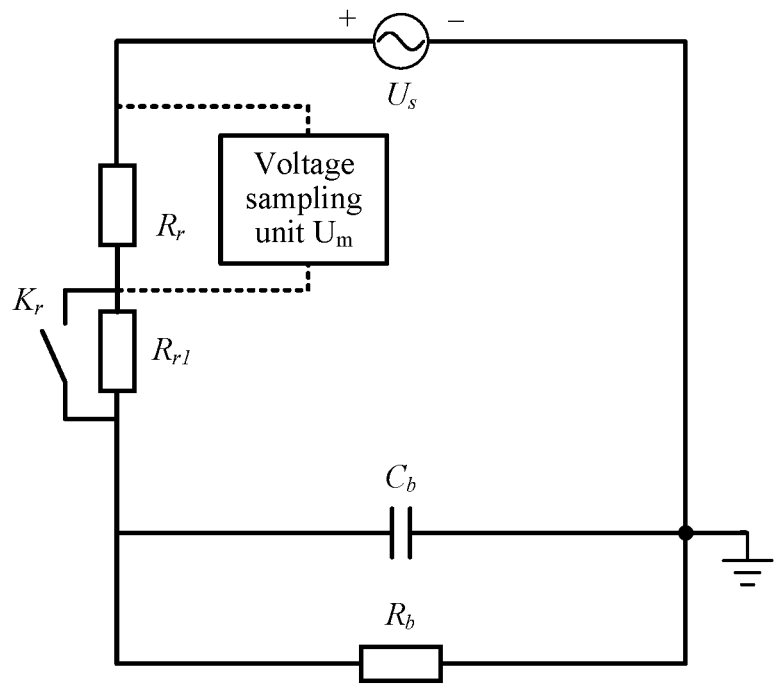
FIG. 8 is an equivalent circuit diagram of a resistance disturbance method according to an embodiment of this application.

In the circuit shown in FIG. 4, the alternating-current signal source $U_s$ is injected, and the insulation resistance parallel value and the parasitic capacitance parallel value may be alternatively calculated by using the resistance disturbance method. FIG. 8 is an equivalent circuit diagram of the resistance disturbance method according to an embodiment of this application. In FIG. 8, $R_b$ is a parallel value of reference ground insulation resistance values $R_p$ and $R_n$ relative to a positive electrode and a negative electrode of the power battery, and $C_b$ is a parallel value of reference ground parasitic capacitance values $C_p$ and $C_n$ relative to the positive electrode and the negative electrode of the power battery. In the resistance disturbance method, an auxiliary resistor and an auxiliary switch, namely, a fifth resistor $R_{r1}$ and a third switch $K_r$, are additionally added on the basis of the circuit diagram in the frequency disturbance method. An insulation resistance detection procedure includes the following steps:

disconnecting the switches $K_1$, $K_2$, and $K_r$, injecting a sine signal with a frequency ω and an amplitude value $U_s$ from the alternating-current signal source $U_s$, and measuring a voltage $U_{m1}$ at two ends of the auxiliary resistor $R_r$ to obtain the following equation:

$$|U_{m2}| = \frac{(R_r + R_{r1})\sqrt{(\omega C_b R_b)^2 + 1^2}}{\sqrt{(\omega C_b R_b(R_r + R_{r1}))^2 + (R_b + R_r + R_{r1})^2}}|U_s|; \quad (7)$$

closing the auxiliary switch $K_r$, and measuring a voltage $U_{m2}$ at the two ends of the auxiliary resistor $R_r$ to obtain the following equation:

$$|U_{m1}| = \frac{R_r\sqrt{(\omega C_b R_b)^2 + 1^2}}{\sqrt{(\omega C_b R_b R_r)^2 + (R_b + R_r)^2}}|U_s|; \quad (8)$$

and obtaining the insulation resistance parallel value $R_b$ and the parasitic capacitance parallel value $C_b$ by combining the equation (7) and the equation (8).

In the specific embodiment of the solution shown in FIG. 4, the alternating-current signal source $U_s$ is injected, and the insulation resistance parallel value and the parasitic capacitance parallel value may be alternatively calculated by using the amplitude phase method. An additional circuit is not required in the amplitude phase method, and an equivalent circuit in the amplitude phase method is the same as that in the frequency disturbance method, as shown in FIG. 6. The amplitude phase method includes the following steps:

disconnecting the switches $K_1$ and $K_2$, injecting a sine signal with a frequency ω and an amplitude value $U_s$ from the alternating-current signal source $U_s$, and measuring a voltage $U_m$ at two ends of the auxiliary resistor $R_r$ and a voltage $U_m$ of the alternating-current signal source $U_s$ to obtain a phase difference Δφ, so as to separately construct an amplitude equation and a phase equation:

$$|U_{m1}| = \frac{R_r\sqrt{(\omega C_b R_b)^2 + 1^2}}{\sqrt{(\omega C_b R_b R_r)^2 + (R_b + R_r)^2}}|U_s|, \quad (9)$$

and $$\Delta\varphi = \arctan\frac{1}{\omega C R_b} - \arctan\frac{R_r + R_b}{R_r R_b \omega C_b}; \quad (10)$$

and obtaining the insulation resistance parallel value $R_b$ and the parasitic capacitance parallel value $C_b$ by combining the equation (9) and the equation (10).

The insulation resistance detection method and detection circuit of the battery provided in the embodiments of this application can achieve the following technical effects:

1. A resonant cavity including a capacitive component and an inductive component is introduced to an active injected detection network, and the capacitor can isolate a direct-current high voltage of the power battery, and therefore the introduced active injected detection network does not reduce insulation resistance of the power battery. A resonant circuit is in a resonant state (or at a resonant point nearby), and an equivalent impedance is zero (or approximately zero), and therefore values of the capacitor $C_r$ and the inductor $L_r$ do not affect insulation resistance calculation.

2. The three methods: the frequency disturbance method, the resistance disturbance method, and the amplitude phase method may be used to calculate the insulation resistance parallel value in the active injected detection network, where the frequency disturbance method has highest calculation precision, and is easy to implement, without requiring an additional apparatus.

3. The insulation resistance parallel value $R_b$ is compared with the resistance threshold $R_{th}$, and the insulation status of the power battery is divided into three states, so that accurate determining can be implemented. An auxiliary resistor is connected through an auxiliary switch only when system insulation performance is relatively poor, and the auxiliary resistor has little impact on the insulation status of the power battery.

4. The insulation resistance values $R_p$ and $R_n$ are obtained through calculation by using the improved balancing bridge method. Compared with the conventional balancing bridge method, this method reduces one voltage detection unit by increasing resistance disturbance once, thereby simplifying a voltage measurement circuit.

Figure 9:
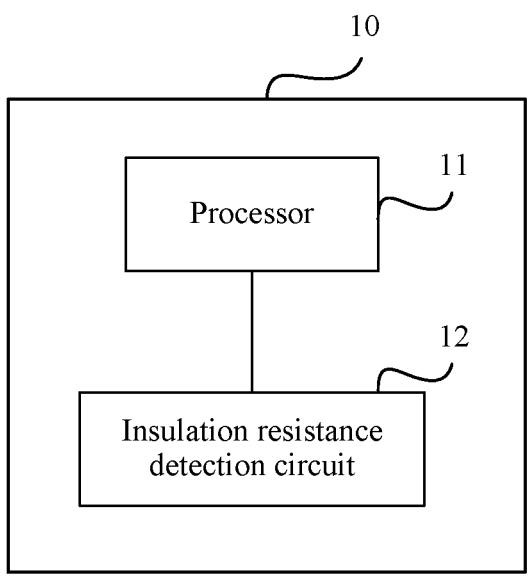
FIG. 9 is a schematic structural diagram of an insulation resistance detection apparatus according to an embodiment of this application.

FIG. 9 is a schematic structural diagram of an insulation resistance detection apparatus according to an embodiment of this application. As shown in FIG. 9, the insulation resistance detection apparatus is applied to an apparatus (for example, a computer or another terminal device) used for insulation resistance detection by using the insulation resistance detection circuit provided in the foregoing solution.

The insulation resistance detection apparatus includes a processor 11 and an insulation resistance detection circuit 12 provided in the foregoing embodiment. The processor 11 is electrically connected to the insulation resistance detection circuit. When a to-be-detected battery is detected, the to-be-detected battery is connected to the insulation resistance detection circuit in the manner shown in the foregoing principle diagram. The processor 11 is configured to: control to execute the following solution, and collect data for calculation and analysis. Details are as follows:

The processor 11 is configured to: control the alternating-current signal source to provide an alternating-current signal, and detect a voltage of a first resistor.

The processor is further configured to: construct an equation based on the alternating-current signal and the voltage of the first resistor, and obtain an insulation resistance parallel value and a parasitic capacitance parallel value of the to-be-detected battery.

Optionally, the processor 11 is further configured to determine, based on the insulation resistance parallel value, whether an insulation failure occurs on the to-be-detected battery.

Optionally, the processor 11 is specifically configured to:

if the insulation resistance parallel value is greater than a preset resistance threshold, determine that no insulation failure occurs on the to-be-detected battery;

if the insulation resistance parallel value is less than the resistance threshold and greater than half of the resistance threshold, obtain a positive electrode insulation resistance and a negative electrode insulation resistance of the to-be-detected battery, and determine, based on the positive electrode insulation resistance and the negative electrode insulation resistance, whether an insulation failure occurs on the to-be-detected battery; or if the insulation resistance parallel value is less than half of the resistance threshold, determine that an insulation failure occurs on the to-be-detected battery.

Optionally, the processor 11 is further specifically configured to:

control to disconnect a first switch and a second switch;

control the alternating-current signal source to inject a sine signal with a frequency $\omega_1$ and an amplitude value $U_s$, and detect that a voltage at two ends of the first resistor is $U_{m1}$; and control the alternating-current signal source to inject a sine signal with a frequency $\omega_2$ and an amplitude value $U_s$, and detect that a voltage at the two ends of the first resistor is $U_{m2}$; and the constructing an equation based on the alternating-current signal and the voltage of the first resistor, and obtaining an insulation resistance parallel value and a parasitic capacitance parallel value of a to-be-detected battery includes:

constructing an equation (1) based on $U_s$ and $U_{m1}$:

$$|U_{m1}| = \frac{R_r\sqrt{(\omega C_b R_b)^2 + 1^2}}{\sqrt{(\omega_1 C_b R_b R_r)^2 + (R_b + R_r)^2}}|U_s|;$$

constructing an equation (2) based on $U_s$ and $U_{m2}$:

$$|U_{m2}| = \frac{R_r\sqrt{(\omega_2 C_b R_b)^2 + 1^2}}{\sqrt{(\omega_2 C_b R_b R_r)^2 + (R_b + R_r)^2}}|U_s|;$$

and obtaining the insulation resistance parallel value $R_b$ and the parasitic capacitance parallel value $C_b$ of the to-be-detected battery through calculation according to the equation (1) and the equation (2), where $R_r$ represents a resistance value of the first resistor.

Optionally, the processor 11 is further specifically configured to:

control to turn off the alternating-current signal source;

close a first switch, obtain a voltage $U_{n1}$ of a third resistor through detection, and construct an equation (3) based on a voltage U of the to-be-detected battery and the voltage $U_{n1}$ of the third resistor:

$$\frac{U(R_p // (R_1 + R_2))}{R_p // (R_1 + R_2) + R_n} \frac{R_2}{R_1 + R_2} = U_{n1};$$

close the first switch and a second switch, obtain a voltage $U_{n2}$ of the third resistor through detection, and construct an equation (4) based on the voltage U of the to-be-detected battery and the voltage $U_{n1}$ of the third resistor:

$$\frac{U(R_p // (R_1 + R_2))}{R_p // (R_1 + R_2) + R_n // R_3} \frac{R_2}{R_1 + R_2} = U_{n2};$$

and obtain the positive electrode insulation resistance $R_p$ and the negative electrode insulation resistance $R_n$ of the to-be-detected battery through calculation according to the equation (3), the equation (4), and an equation (5)

$$\frac{R_p R_n}{R_p + R_n} = R_b,$$

where $R_1$ represents a resistance value of the second resistor, $R_2$ represents a resistance value of the third resistor, $R_3$ represents a resistance value of a fourth resistor, and $R_b$ represents the insulation resistance parallel value of the to-be-detected battery.

Optionally, the processor 11 is further configured to:

if both the positive electrode insulation resistance and the negative electrode insulation resistance are greater than the resistance threshold, determine that no insulation failure occurs on the to-be-detected battery; or if neither the positive electrode insulation resistance nor the negative electrode insulation resistance is greater than the resistance threshold, determine that an insulation failure occurs on the to-be-detected battery.

The insulation resistance detection apparatus provided in this embodiment is configured to execute the technical solution of the foregoing detection method. An implementation principle and a technical solution of the insulation resistance detection apparatus are similar to those of the detection method. Details are not described herein again.

An embodiment of this application further provides a device, including at least one processor, a memory, and a communications interface. The at least one processor, the memory, and the communications interface are connected to each other; the memory stores a computer-executable instruction; and the at least one processor executes the computer-executable instruction stored in the memory, so that the device exchanges data with an insulation resistance detection circuit of the device through the communications interface to perform the insulation resistance detection method provided in the foregoing various implementations.

An embodiment of this application further provides a readable storage medium. The readable storage medium stores a computer-executable instruction. When at least one processor of a device executes the computer-executable instruction, the device performs the insulation resistance detection method provided in the foregoing various implementations.

An embodiment of this application further provides a program product. The program product includes an executable instruction, and the executable instruction is stored in a readable storage medium. At least one processor of a device may read the executable instruction from the readable storage medium, and the at least one processor executes the executable instruction, so that the device implements the insulation resistance detection method provided in the foregoing various implementations.

It should be understood that in the foregoing embodiments, the processor may be a central processing unit (CPU for short), or may be another general-purpose processor, a digital signal processor (DSP for short), an application-specific integrated circuit (ASIC for short), or the like. The general-purpose processor may be a microprocessor or the processor may be any conventional processor, or the like. The steps of the method disclosed with reference to the embodiments of this application may be directly performed by a hardware processor, or may be performed by using a combination of hardware in the processor and a software module.

What is claimed is:

1. An insulation resistance detection circuit, comprising:
an alternating-current signal source, a resonant cavity, a first resistor, a second resistor, a third resistor, a fourth resistor, a first switch, and a second switch; and
a first voltage sampling unit and a second voltage sampling unit, wherein the first voltage sampling unit is connected to the first resistor in parallel, to detect a voltage at two ends of the first resistor; and the second voltage sampling unit is connected to the third resistor in parallel, to detect a voltage at two ends of the third resistor, wherein
the alternating-current signal source is sequentially connected to the first resistor, the resonant cavity, the first switch, the second resistor, and the third resistor in series to form a loop, wherein the first resistor is connected to a positive electrode of the alternating-current signal source, and the third resistor is connected to a negative electrode of the alternating-current signal source;
a positive electrode of a to-be-detected battery is connected between the first switch and the resonant cavity, and the negative electrode of the alternating-current signal source is connected to ground;
one end of the second switch is connected to a negative electrode of the to-be-detected battery, the other end of the second switch is connected to the fourth resistor, and the other end of the fourth resistor is connected to the ground;
the resonant cavity comprises a capacitor and an inductor that are connected in series, and
when the to-be-detected battery is detected, the alternating-current signal source is configured to provide an alternating-current signal.

2. The insulation resistance detection circuit according to claim 1, further comprising a fifth resistor and a third switch, wherein
the fifth resistor is connected between the alternating-current signal source and the resonant cavity in series, and the third switch is connected to two ends of the fifth resistor in parallel.

3. An insulation resistance detection circuit, comprising:
an alternating-current signal source, a resonant cavity, a first resistor, a second resistor, a third resistor, a fourth resistor, a first switch, and a second switch,
a first voltage sampling unit and a second voltage sampling unit, wherein the first voltage sampling unit is connected to the first resistor in parallel, to detect a voltage at two ends of the first resistor; and the second voltage sampling unit is connected to the third resistor in parallel, to detect a voltage at two ends of the third resistor, wherein
the alternating-current signal source is sequentially connected to the first resistor, the resonant cavity, the first switch, the second resistor, and the third resistor in series to form a loop, wherein the first resistor is connected to a positive electrode of the alternating-current signal source, and the third resistor is connected to a negative electrode of the alternating-current signal source;
a negative electrode of a to-be-detected battery is connected between the first switch and the resonant cavity, and the negative electrode of the alternating-current signal source is connected to ground;
one end of the second switch is connected to a positive electrode of the to-be-detected battery, the other end of the second switch is connected to the fourth resistor, and the other end of the fourth resistor is connected to the ground;
the resonant cavity comprises a capacitor and an inductor that are connected in series, and
when the to-be-detected battery is detected, the alternating-current signal source is configured to provide an alternating-current signal.

4. The insulation resistance detection circuit according to claim 3, further comprising a fifth resistor and a third switch, wherein
the fifth resistor is connected between the alternating-current signal source and the resonant cavity in series, and the third switch is connected to two ends of the fifth resistor in parallel.

5. An insulation resistance detection apparatus comprising:
a processor configured to:
control the alternating-current signal source to provide an alternating-current signal,
detect a voltage of a first resistor;
construct an equation based on the alternating-current signal and the voltage of the first resistor;
obtain an insulation resistance parallel value and a parasitic capacitance parallel value of a to-be-detected battery; and
determine, based on the insulation resistance parallel value, whether an insulation failure occurs on the to-be-detected battery, wherein the insulation failure occurs when the insulation resistance parallel value is less than half of the resistance threshold.

6. The apparatus according to claim 5, wherein the processor is further configured to:
determine that no insulation failure occurs on the to-be-detected battery, wherein the insulation resistance parallel value is greater than a reset resistance threshold.

7. The apparatus according to claim 5, wherein the processor is further configured to:
control to disconnect a first switch and a second switch;
control the alternating-current signal source to inject a sine signal with a frequency $\omega_1$ and an amplitude value $U_s$, and detect that a voltage at two ends of the first resistor is $U_{m1}$; and
control the alternating-current signal source to inject a sine signal with a frequency $\omega_2$ and an amplitude value $U_s$, and detect that a voltage at the two ends of the first resistor is $U_{m2}$; and
wherein the constructing an equation based on the alternating-current signal and the voltage of the first resistor, and obtaining an insulation resistance parallel value and a parasitic capacitance parallel value of a to-be-detected battery comprises:
constructing an equation (1) based on $U_s$ and $U_{m1}$:

$$|U_{m1}| = \frac{R_r\sqrt{(\omega_1 C_b R_b)^2 + 1^2}}{\sqrt{(\omega_1 C_b R_b R_r)^2 + (R_b + R_r)^2}}|U_s|;$$

constructing an equation (2) based on $U_s$ and $U_{m2}$:

$$|U_{m2}| = \frac{R_r\sqrt{(\omega_2 C_b R_b)^2 + 1^2}}{\sqrt{(\omega_2 C_b R_b R_r)^2 + (R_b + R_r)^2}}|U_s|;$$

and obtaining the insulation resistance parallel value $R_b$ and the parasitic capacitance parallel value $C_b$ of the to-be-detected battery through calculation according to the equation (1) and the equation (2), wherein $R_r$ represents a resistance value of the first resistor.

8. The apparatus according to claim 5, wherein the processor is further configured to:

control to turn off the alternating-current signal source;

close a first switch, obtain a voltage $U_{n1}$ of a third resistor through detection, and construct an equation (3) based on a voltage U of the to-be-detected battery and the voltage $U_{n1}$ of the third resistor:

$$\frac{U(R_p // (R_1 + R_2))}{R_p // (R_1 + R_2) + R_n} \frac{R_2}{R_1 + R_2} = U_{n1};$$

close the first switch and a second switch, obtain a voltage $U_{n2}$ of the third resistor through detection, and construct an equation (4) based on the voltage U of the to-be-detected battery and the voltage $U_{n1}$ of the third resistor:

$$\frac{U(R_p // (R_1 + R_2))}{R_p // (R_1 + R_2) + R_n // R_3} \frac{R_2}{R_1 + R_2} = U_{n2};$$

and obtain the positive electrode insulation resistance $R_p$ and the negative electrode insulation resistance $R_n$ of the to-be-detected battery through calculation according to the equation (3), the equation (4), and an equation (5)

$$\frac{R_p R_n}{R_p + R_n} = R_b,$$

wherein $R_1$ represents a resistance value of the second resistor, $R_2$ represents a resistance value of the third resistor, $R_3$ represents a resistance value of a fourth resistor, and $R_b$ represents the insulation resistance parallel value of the to-be-detected battery.

9. The apparatus according to claim 8, wherein the processor is further configured to:

determine that no insulation failure occurs on the to-be-detected battery in response to both the positive electrode insulation resistance and the negative electrode insulation resistance being greater than the resistance threshold.

10. The apparatus according to claim 5, wherein the processor is configured to:

obtain a positive electrode insulation resistance and a negative electrode insulation resistance of the to-be-detected battery, wherein the insulation resistance parallel value is less than the resistance threshold and greater than half of the resistance threshold, and determine, based on the positive electrode insulation resistance and the negative electrode insulation resistance, whether an insulation failure occurs on the to-be-detected battery.

11. The apparatus according to claim 10, wherein the processor is further configured to:

determine that an insulation failure occurs on the to-be-detected battery, wherein neither the positive electrode insulation resistance nor the negative electrode insulation resistance is greater than the resistance threshold.

12. The apparatus according to claim 10, wherein the processor is further configured to:

control to turn off the alternating-current signal source;

close a first switch, obtain a voltage $U_{n1}$ of a third resistor through detection, and construct an equation (3) based on a voltage U of the to-be-detected battery and the voltage $U_{n1}$ of the third resistor:

$$\frac{U(R_p // (R_1 + R_2))}{R_p // (R_1 + R_2) + R_n} \frac{R_2}{R_1 + R_2} = U_{n1};$$

close the first switch and a second switch, obtain a voltage $U_{n2}$ of the third resistor through detection, and construct an equation (4) based on the voltage U of the to-be-detected battery and the voltage $U_{n1}$ of the third resistor:

$$\frac{U(R_p // (R_1 + R_2))}{R_p // (R_1 + R_2) + R_n // R_3} \frac{R_2}{R_1 + R_2} = U_{n2};$$

and obtain the positive electrode insulation resistance $R_p$ and the negative electrode insulation resistance $R_n$ of the to-be-detected battery through calculation according to the equation (3), the equation (4), and an equation (5)

$$\frac{R_p R_n}{R_p + R_n} = R_b,$$

wherein $R_1$ represents a resistance value of the second resistor, $R_2$ represents a resistance value of the third resistor, $R_3$ represents a resistance value of a fourth resistor, and $R_b$ represents the insulation resistance parallel value of the to-be-detected battery.

13. The apparatus according to claim 10, wherein the processor is further configured to:

determine that no insulation failure occurs on the to-be-detected battery in response to both the positive electrode insulation resistance and the negative electrode insulation resistance being greater than the resistance threshold.

\* \* \* \* \*